United States Patent
Farrow et al.

(10) Patent No.: US 7,736,979 B2
(45) Date of Patent: Jun. 15, 2010

(54) METHOD OF FORMING NANOTUBE VERTICAL FIELD EFFECT TRANSISTOR

(75) Inventors: Reginald Conway Farrow, Somerset, NJ (US); Amit Goyal, Harrison, NJ (US)

(73) Assignee: New Jersey Institute of Technology, Newark, NJ (US)

( * ) Notice: Subject to any disclaimer, the term of this patent is extended or adjusted under 35 U.S.C. 154(b) by 267 days.

(21) Appl. No.: 11/765,788

(22) Filed: Jun. 20, 2007

(65) Prior Publication Data

US 2008/0315302 A1 Dec. 25, 2008

(51) Int. Cl.
*H01L 29/78* (2006.01)
*H01L 21/336* (2006.01)

(52) U.S. Cl. .............. 438/270; 257/332; 257/E21.41; 257/E29.262; 977/938

(58) Field of Classification Search ............. 977/902, 977/932–938; 257/E39, E51.038–E51.04, 257/E23.074, E23.165, E39.013, E29.322, 257/E49.003, E21.404, E21.408

See application file for complete search history.

(56) References Cited

U.S. PATENT DOCUMENTS

| | | | |
|---|---|---|---|
| 6,515,325 B1 | 2/2003 | Farnworth et al. | |
| 6,566,704 B2 | 5/2003 | Choi et al. | |
| 6,616,497 B1 | 9/2003 | Choi et al. | |
| 6,740,910 B2 * | 5/2004 | Roesner et al. | 257/213 |
| 6,830,981 B2 | 12/2004 | Lee et al. | |
| 6,858,891 B2 | 2/2005 | Farnworth et al. | |
| 6,933,222 B2 | 8/2005 | Dubin et al. | |
| 6,979,590 B2 * | 12/2005 | Rueckes et al. | 438/99 |
| 6,995,046 B2 | 2/2006 | Rueckes et al. | |
| 7,045,421 B2 | 5/2006 | Rueckes et al. | |
| 7,081,385 B2 | 7/2006 | Farnworth et al. | |
| 7,091,096 B2 | 8/2006 | Balasubramanian et al. | |
| 7,132,714 B2 | 11/2006 | Bae et al. | |
| 7,135,773 B2 | 11/2006 | Furukawa et al. | |

(Continued)

FOREIGN PATENT DOCUMENTS

JP 2001312953 11/2001

(Continued)

OTHER PUBLICATIONS

Choi, W. B. et al, "Carbon Nanotube for Nanoelectronics", IEEE-NANO 2003, San Francisco, CA, 2003.

(Continued)

*Primary Examiner*—Evan Pert
*Assistant Examiner*—Andres Munoz
(74) *Attorney, Agent, or Firm*—McCarter & English, LLP

(57) ABSTRACT

A nanotube field effect transistor and a method of fabrication are disclosed. The method includes electrophoretic deposition of a nanotube to contact a region of a conductive layer defined by an aperture. Embodiments of the present disclosure provide a method of depositing nanotubes in a region defined by an aperture, with control over the number of nanotubes to be deposited, as well as the pattern and spacing of nanotubes. For example, electrophoretic deposition, along with proper configuration of the aperture, allows at least one nanotube to be deposited in a target region with nanometer scale precision. Pre-sorting of nanotubes, e.g., according to their geometries or other properties, may be used in conjunction with embodiments of the present disclosure to facilitate fabrication of devices with specific performance requirements.

15 Claims, 10 Drawing Sheets

U.S. PATENT DOCUMENTS

| | | | |
|---|---|---|---|
| 7,211,844 | B2 | 5/2007 | Furukawa et al. |
| 2003/0102222 | A1* | 6/2003 | Zhou et al. ............... 205/109 |
| 2005/0156203 | A1 | 7/2005 | Bae et al. |
| 2005/0167655 | A1* | 8/2005 | Furukawa et al. ............ 257/20 |
| 2006/0169972 | A1 | 8/2006 | Furukawa et al. |
| 2006/0286023 | A1 | 12/2006 | Huang |
| 2007/0122986 | A1 | 5/2007 | Sandhu et al. |

FOREIGN PATENT DOCUMENTS

| | | |
|---|---|---|
| JP | 2006111498 | 4/2006 |
| WO | WO 03/081687 A2 | 10/2003 |

OTHER PUBLICATIONS

K. Yamoto et al., "Orientation and Purification of Carbon Nanotubes Using AC Electrophoresis," J. Phys. D: Appl. Phys. 31 (1998), pp. L34-L36.

W. B. Choi et al., "Electrophoresis Deposition of Carbon Nanotubes for Triode-Type Field Emission Display," Applied Physics Letters, vol. 78, No. 11, Mar. 12, 2001, pp. 1547-1549.

G. S. Duesberg et al., "Growth of Isolated Carbon Nanotubes with Lithographically Defined Diameter and Location," Nano Letters, 2003, vol. 3, No. 2, pp. 257-259.

W. Hoenlein et al., "Carbon Nanotubes for Microelectronics: Status and Future Prospects," Materials Science and Engineering C23 (2003) pp. 663-669.

G. S. Duesberg et al., "Ways Towards The Scaleable Integration of Carbon Nanotubes into Silicon Based Technology," Diamond and Relatled Materials 13 (2004) pp. 354-361.

A. P. Graham et al., "Towards the Integration of Carbon Nanotubes in Microelectronics," Diamond and Related Materials 13 (2004) 1296-1300.

J. Hahn et al., "Fabrication of Clean Carbon Nanotube Field Emitters," Applied Physics Letters 88, 113101 (2006).

H. Kim et al., "Parallel Patterning of Nanoparticles via Electrodynamic Focusing of Charged Aerosols," Nature Nanotechnology, vol. 1, Nov. 2006, pp. 117-121.

W. B. Choi, "Ultrahigh-Density Nanotransistors by Using Selectively Grown Vertical Carbon Nanotubes," Applied Physics Letters, vol. 79, No. 22, Nov. 26, 2001, pp. 3696-3698.

J. Bae et al, "Field Emission Properties of Carbon Nanotubes Deposited by Electrophoresis," Physica B 323 (2002), pp. 168-170.

H. Ma, et al., "Electron Field Emission Properties of Carbon Nanotubes-Deposited Flexible Film," Applied Surface Science 251 (2005) pp. 258-261.

D. A. Kurnosov, et al., "Influence of the Interelectrode Distance in Electrophoretic Cold Cathode Fabrication on the Emission Uniformity," Applied Surface Science 215 (2003) pp. 232-236.

Notification Of Transmittal Of The International Search Report And The Written Opinion Of The International Searching Authority, mailed Mar. 6, 2009 (9 pages).

* cited by examiner

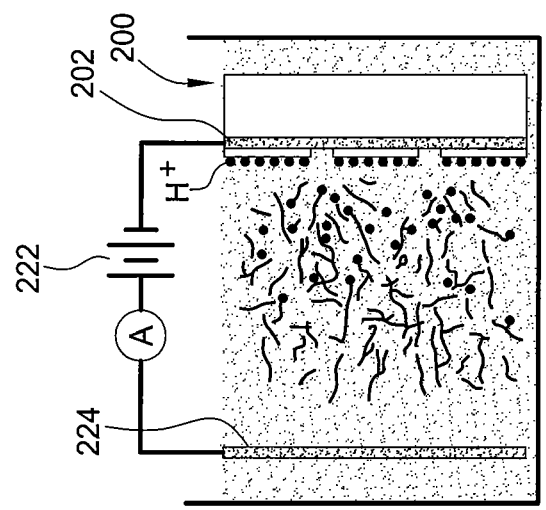
FIG. 2B
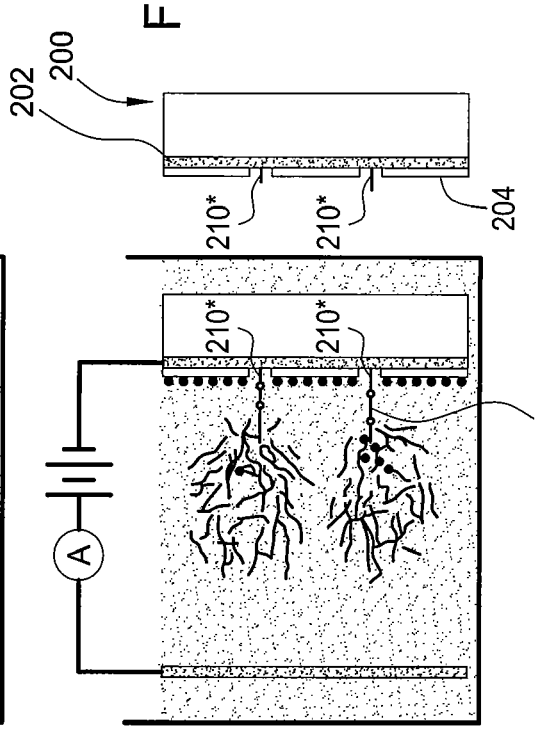
FIG. 2E
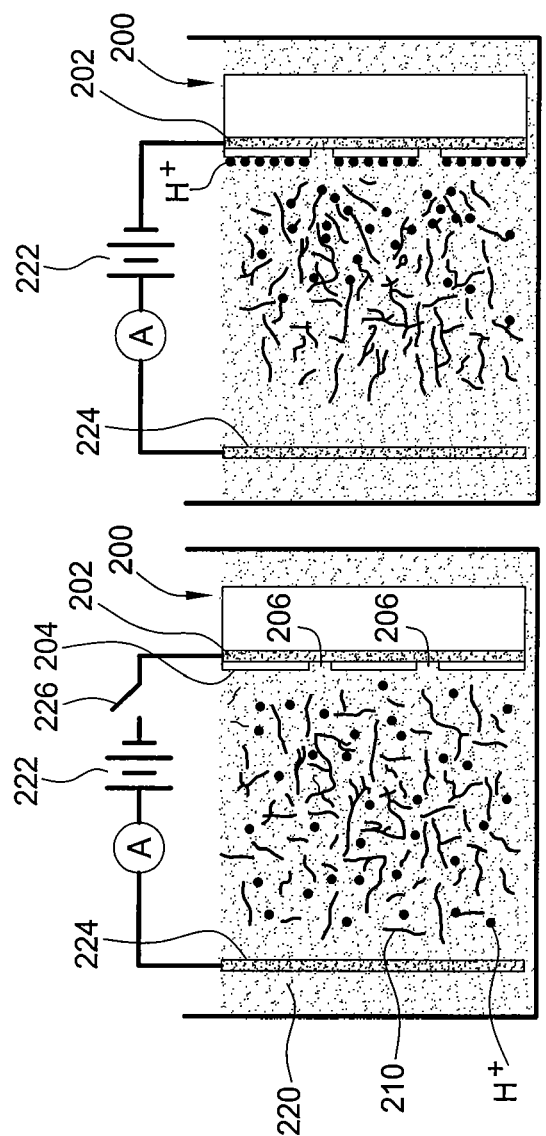
FIG. 2A
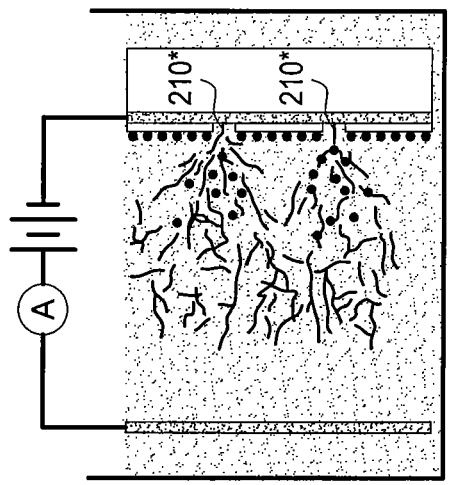
FIG. 2C
FIG. 2D

METHOD OF FORMING NANOTUBE VERTICAL FIELD EFFECT TRANSISTOR

STATEMENT OF GOVERNMENT RIGHTS

This invention was made with U.S. Government support under grant contract number AFOSR Grant: FA9550-05-1-0461 awarded by the Air Force Office of Scientific Research. The Government has certain rights in this invention.

CROSS REFERENCE TO RELATED APPLICATIONS

This application contains subject matter related to commonly owned U.S. patent application Ser. No. 11/765,735, now U.S. Patent Publication No. 2008/0317631, entitled "Nanotube Device and Method of Fabrication," filed concurrently herewith, which is herein incorporated by reference in its entirety.

FIELD OF THE INVENTION

The present invention generally relates to a method of forming a nanotube vertical field effect transistor.

BACKGROUND OF THE INVENTION

There are many applications where a nanotube, e.g., a carbon nanotube (CNT), or an array of nanotubes, can be employed as a sensing or active device element in an electrical probe or electronic device. In these applications, electrical contact must be made with the nanotube, which requires accurate positioning of the nanotube with respect to various conductive links (i.e. interconnects) and other circuitry.

Aside from the need for precise alignment, properties of the nanotube also need to be controlled in order to provide device performance according to desired specifications. For example, many transistor applications for CNTs are best achieved with single wall carbon nanotubes (SWNT) rather than multi-wall carbon nanotubes (MWNT). Furthermore, as an active element of a transistor, a semiconducting SWNT, rather than a metallic SWNT, is required. For other applications such as interconnects and nanoprobes, however, a metallic CNT is preferred.

Existing fabrication methods for CNT devices do not fully address both needs for alignment and property control. In addition, in CNT electrical device fabrication, at least one interconnect level may be processed before CNT deposition. The most common metallization schemes, e.g., with aluminum and copper interconnects, often impose thermal budget constraints for subsequent processing steps. Chemical vapor deposition (CVD) methods, which are typically used for depositing CNTs, are not compatible with aluminum or copper interconnects because of the relatively high temperatures involved.

SUMMARY OF THE INVENTION

Embodiments of the present invention provide a method of fabricating vertical nanotube field effect transistors.

One embodiment provides a method of forming a nanotube field effect transistor (FET) that includes: providing a multilayer stack having materials in an order of: a first conductive layer, a first insulating layer, a second conductive layer, and a second insulating layer, forming a first aperture in at least a top portion of the second insulating layer, forming a second aperture in the second conductive layer and the first insulating layer to expose a region of the first conductive layer, the second aperture being centrally aligned with respect to the first aperture and having a diameter smaller than a diameter of the first aperture, and depositing a nanotube on the first conductive layer by electrophoresis.

Another embodiment provides a method of forming a nanotube field effect transistor (FET) that includes: providing a structure having at least a top conductive layer over an insulating layer formed on a bottom conductive layer, forming an aperture through the top conductive layer and the insulating layer to expose a vertical sidewall of the top conductive layer and a horizontal region of the first conductive layer, forming a dielectric layer over the vertical sidewall of the top conductive layer, depositing one nanotube on the first conductive layer by electrophoresis, with a first end of the nanotube contacting the conductive layer proximate a center of the horizontal region, and orienting the nanotube to provide contact between an intermediate portion of the nanotube and the dielectric layer.

Another embodiment provides a method of forming a semiconductor structure that includes: forming a horizontal field effect transistor (FET) on a substrate, forming a vertical nanotube field effect transistor (NT-FET) over the horizontal FET, wherein the vertical NT-FET is formed using a method that includes: (a) providing a structure having at least a first insulating layer on a first conductive layer, (b) forming a first aperture in the first insulating layer to expose a region of the first conductive layer, (c) depositing at least one nanotube on the first conductive layer by electrophoresis, the at least one nanotube having one end contacting the first conductive layer proximate a center of the exposed region, wherein the first conductive layer forms one of a source or a drain of the NT-FET.

Another embodiment provides a method of forming a plurality of nanotube field effect transistors, the method includes providing a first insulating layer over a first conductive layer, forming an elongated aperture in the first insulating layer to expose a region of the first conductive layer, the aperture characterized by a width and a length larger than the width, depositing a number of nanotubes in a line pattern on the first conductive layer by electrophoresis, in which the width of the aperture is sufficiently small to restrict deposition of the nanotubes to the line pattern and the number of nanotubes is determined by the length of the aperture.

Yet another embodiment provides a semiconductor device that includes: a substrate having at least one horizontal complementary metal oxide semiconductor (CMOS) device, the CMOS having at least three metal interconnect levels, a vertical carbon nanotube field effect transistor (CNT-FET) formed over the CMOS device, in which the vertical CNT-FET has a source, a drain and a gate formed from materials in the respective three metal interconnect levels of the CMOS device.

BRIEF DESCRIPTION OF THE DRAWINGS

The teachings of the present invention can be readily understood by considering the following detailed description in conjunction with the accompanying drawings, in which:

FIGS. 2A-E are schematic diagrams illustrating an experimental setup and a process sequence for depositing a carbon nanotube according to one embodiment of the present invention;

To facilitate understanding, identical reference numerals have been used, where possible, to designate identical elements that are common to the figures.

DETAILED DESCRIPTION

In the fabrication of CNT devices, there is often a need to provide a vertically oriented CNT inside an aperture. In transistor fabrication processes, depending on the specific stage or levels, the aperture is also referred to as a via.

Embodiments of the present invention provide a method of depositing nanotubes in a region defined by an aperture, with control over the number of nanotubes to be deposited, as well as the pattern and spacing of nanotubes. Specifically, electrophoretic deposition, along with proper configuration of the aperture, allows at least one nanotube to be deposited in a target region with nanometer scale precision. Pre-sorting of nanotubes, e.g., according to their geometries or other properties, may be used in conjunction with embodiments of the invention to facilitate fabrication of devices with specific performance requirements.

Figure 1:
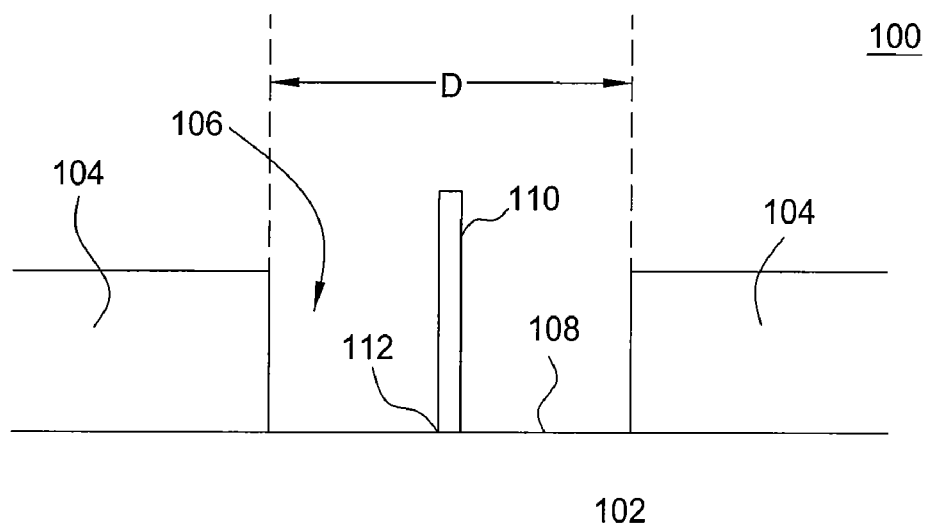
FIG. 1 is a schematic cross-sectional view of a nanotube-based structure that can be fabricated using embodiments of the present invention.

FIG. 1A is a schematic cross-sectional view of a nanotube structure 100 that can be fabricated using embodiments of the present invention. The structure 100 includes a substrate 102, over which an insulating material layer 104 has been deposited. The insulating layer 104 has been patterned to form an aperture 106, which exposes a top surface 108 of the substrate 102. A single CNT 110 is deposited inside the aperture 106 so that one end 112 of the CNT 110 contacts the top surface of the substrate 102. The substrate 102 is a conducting material such as a metal or a conducting film (deposited over an insulating material) that allows a bias voltage to be applied for electrophoretic deposition of the nanotube 110.

Embodiments of the present invention allow the CNT 110 to be deposited inside the aperture 106, to the exclusion of other CNTs. The aperture 106, which has to be sufficiently large to accommodate the CNT 110, may be patterned using different lithographic processes. Thus, in one embodiment, the aperture 106 may have a diameter (D) ranging from about the lower limit (e.g., resolution) of the lithography process to about 100 nm. For example, existing lithography at 193 nm readily provides a resolution limit of about 90 nm. In one embodiment, the substrate 102 has a lateral dimension (e.g., extending across the aperture) sufficiently large to meet level-to-level overlay constraints with respect to the aperture 106. As will be shown below, the CNT 110 can be deposited proximate the center of the aperture 106, e.g., with a lateral alignment precision of a few nanometers. Furthermore, the CNT 110 may be pre-selected to have a preferred physical property including multiwall CNT versus single wall CNT and or conducting CNT versus semiconducting CNT.

FIGS. 2A-D illustrate schematically an experimental setup for electrophoresis and a sequence for depositing a CNT on a substrate according to one embodiment of the present invention. Electrophoretic deposition (EPD) is driven by the motion of charged particles, dispersed in a suitable solvent, towards an electrode under the influence of an electric field. Particles less than about 30 μm size can be used in suspensions with low solid loading and low viscosity. In general, whether nanutubes are deposited in the form of bundles or individual tubes depends on the nature of the suspension and the relative mobilities of each, which depends on their shapes and the associated resistance to diffuse towards the contact surface inside the apertures or vias.

FIG. 2A shows a substrate structure 200 with a conductive layer 202. An insulating layer 204 is provided over the conductive layer 202, and one or more apertures 206 are patterned in the insulating layer 204. The substrate structure 200 is immersed in a liquid bath 220, e.g., at room temperature, containing an electrolyte and a suspension of CNTs 210 in a suitable solvent.

Successful EPD requires preparation of a stable dispersion. In general, an electrostatically stabilized dispersion can be obtained with particles of high ζ-potential, while keeping the ionic conductivity of the suspensions low. SWNTs have shown high ζ-potential values at low pH values. It is also known that the presence of charging salts can play an important role in improving adhesion of the nanotubes to substrates and increasing the deposition rates.

In one embodiment, 10 mg of purified SWNTs are suspended in 30 ml of distilled water, and $10^{-4}$ moles of magnesium nitrate hexahydrate [$Mg(NO_3)26H_2O$] is added to the suspension and sonicated for about 2-3 hrs. In general, it is preferable that the nanotubes in the liquid bath 220 be pre-sorted for the type of nanotubes according to application needs. For example, while semiconducting SWNTs are used as active elements in transistors, either semiconducting or metallic nanotubes may be used for probes or other devices. A few drops of non-ionic Triton-X surfactant are added to improve the suspension with a final pH of solution at about 4.

Aside from hydrogen ions ($H^+$), shown as circles in FIG. 2A, the liquid bath 220 also contains magnesium ions, $Mg^{2+}$, which tend to adsorb or attach to the CNTs. An electrode 224, e.g., a platinum electrode, is immersed in the liquid bath 220 and connected to a positive terminal of a DC voltage source 222. The conducting layer 202 is connected to a switch 226.

In FIG. 2A, when the switch 226 is open and there is no current flow inside the liquid bath 220 (current flow may be measured using an ammeter A), the CNTs are randomly distributed in the suspension and any deposition on the substrate will be random.

In FIG. 2B, the switch 226 is closed, thus connecting the conductive layer 202 to a negative terminal of the DC source 222. With a DC potential, e.g., in a range of about 5V-25V, applied across the platinum electrode 224 and the conductive layer 202, charged particles or species in the fluid will move towards either the cathode or the anode. For example, $H^+$ ions and positively charged CNTs will move towards the substrate structure 200, which is the cathode in this case.

Since $H^+$ ions have higher mobility than other positively charged species, including the CNTs, $H^+$ ions will arrive at the substrate structure 200 faster than other charged species, and thus, preferentially accumulate on the surface of the insulating layer 204, as shown in FIG. 2B. The positively charged surfaces of the insulating layer 204 result in an electric field being produced around each aperture 206.

Positively-charged CNTs arriving near the substrate structure 200 are directed by the electric field towards the center of each aperture 206, as shown in FIG. 2C. Details regarding this "focusing" effect will be presented in later discussions. In one embodiment, the apertures 206 and electric field distribution are configured so that only one CNT (shown as CNT 210*) is deposited inside each aperture 206, even though the diameter (or lateral dimension) of the aperture 206 is large enough to physically accommodate additional CNTs. The CNT 210* is disposed inside each aperture 206 in a "longitudinal" manner, i.e., the length of the CNT 210* is along the same direction as the depth of the aperture 206, with one end of the CNT contacting the conductive layer 202.

FIG. 2D shows that the unattached end of CNT 210* tends to align or point towards the platinum electrode, and further, serves as a focal point for additional CNTs. Thus, a second CNT 210A becomes attached to the free end of CNT 210*, e.g., in a lengthwise manner, with additional CNTs attaching to each other end-to-end. The substrate structure 200 is then removed from the bath 220, washed in distilled and de-ionized water, and dried with an inert gas. After drying, only the CNTs 210* that are attached to the conductive layer 202 remain, and the resulting structure, such as one illustrated in FIG. 2E, is ready for further processing.

Since different devices often require different properties of the nanotubes for proper operation and/or optimum performance, it may be advantageous to provide a pre-sorting of the nanotubes prior to electrophoretic deposition. For example, nanotubes may be sorted according to their properties such as semiconducting versus metallic, single-walled versus multi-walled, or they may be sorted according to geometries or dimensions such as lengths, diameters, and so on.

Since different types of nanotubes have different mobilities, e.g., longer or multiwalled nanotubes will generally have lower mobility compared to shorter or single-walled nanotubes, electrophoresis may also be used for sorting purposes. Such sorting can be done prior to the electrophoretic deposition so that the nanotubes in the bath have a relatively uniform distribution in terms of properties and/or geometries. Alternatively, if the nanotubes in the electrophoresis bath have a relatively wide distribution in terms of geometries or other properties, a certain degree of sorting may also be achieved "in situ" during deposition by virtue of the different mobilities of the nanotubes.

The degree of focusing that directs the nanotubes towards the aperture is affected by the magnitude and shape of the electric field distribution, along with the configuration of the aperture. To provide control over the number of deposited nanotubes as well as their positioning, a finite element model is used to investigate the electric field distribution as a function of various input parameters. Parameters or factors that are relevant for controlling nanotube deposition include the aperture configuration, nanotube properties, characteristics of the insulating layer and substrate, bias potential, dielectric properties of the solution, among others. The aperture configuration may generally include the shape, dimensions (e.g., width, length, depth, ratios of dimensions), sidewall profile, and so on. The nanotube properties may generally include the dimensions (e.g., length, diameter), single-walled or multi-walled, semiconducting or metallic.

The electric field around the aperture results from a combination of the potential applied to the metal layer on the substrate structure and charges that accumulate on the surface of the insulating layer. The positive charge accumulation on the dielectric layer covering the cathode creates an electric field that opposes the field arising from the bias applied between the anode and cathode. Once the two electric fields become equal and opposite, positive charges will no longer be attracted to the surface of the insulating layer. This "satura-tion charge density", σ, which determines the strength of the nanoscopic lens from the resulting electric field distribution, can be calculated from:

$$\sigma = \epsilon_0 \epsilon_r E \qquad \text{Eq. (1)}$$

where E is the magnitude of the electric field between the anode and cathode, $\epsilon_0$ is the permittivity of free space, and $\epsilon_r$ is the relative permittivity of the liquid.

As an example, for $E=10^3$ V/m, $\epsilon_0=8.85\times10^{-12}$ Farad/meter and the liquid is water $\epsilon_r=80$, the surface charge density σ is equal to $7.1\times10^{-7}$ Coulomb/meter$^2$.

Once the specific aperture geometry is selected and the surface charge density is calculated, the electric field in the region near the apertures and the motion of positively charged particles can be calculated using finite element analysis techniques that are well known. Thus, with proper configuration and design, one can obtain an electric field distribution to produce a desired focusing or lens effect to direct the nanotube deposition.

Figure 3C:
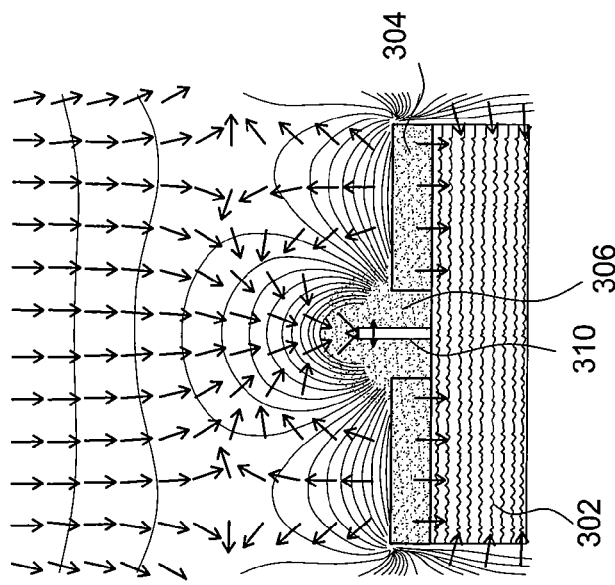
FIGS. 3A-C are schematic illustrations of the electric field distributions around an aperture with a diameter of 100 nm and a depth of 50 nm.
Figure 3B:
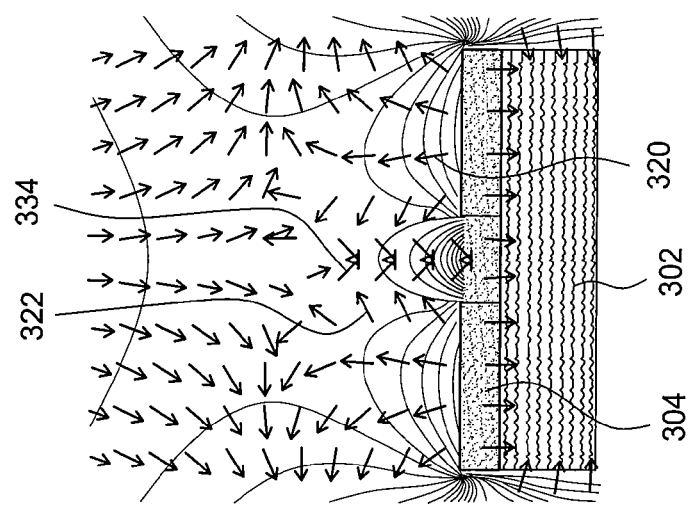
Figure 3A:
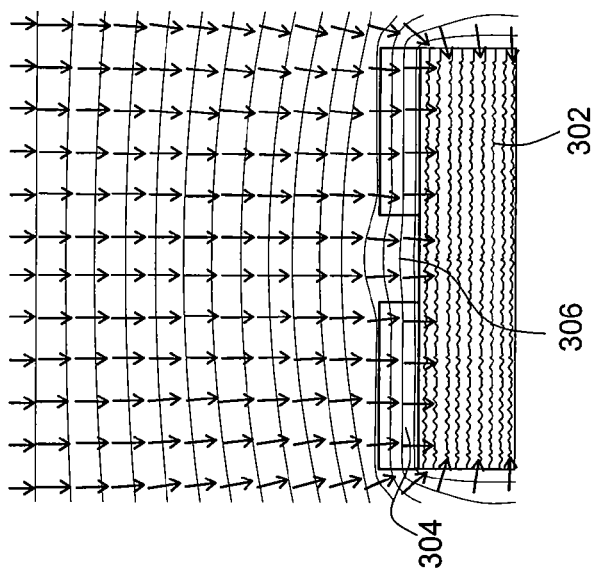

FIGS. 3A-C show the results of electric field distributions around an aperture 306 having a diameter of 100 nm and a depth of 50 nm. In this example, a negative 10V bias is applied to the conductive layer 302. FIG. 3A shows the electric field distribution before H$^+$ ions are accumulated on the insulating surface. The electric field distribution is relatively uniform, with field lines mostly perpendicular to the surfaces of the insulating layer 304. As shown in the figure, the field line directions are indicated by arrows pointing towards a region of negative potential. Only slight deviations of the field lines are seen at or close to the aperture 306.

FIG. 3B shows the modified electric field distribution after the surface of the insulating layer 304 is saturated with H$^+$ ions. The arrows 320 above the insulating layer 304 show that positively charged species will be repelled away from the surface, while arrows 322 on either side of the aperture 306 show that the field lines are directed inwards, i.e., towards an area above the aperture 306. Near the center of the aperture 306, the field lines are directed downwards, i.e., towards the interior of the aperture 306, as indicated by arrows 334. Thus, positively charged species such as CNTs are directed towards the aperture 306.

After sufficient charges have accumulated to reach the charge saturation point, the electrostatic lens effect will direct all charged particles towards the center of the aperture 306. The equipotential lines for this geometry favor the focusing of mobile charged nanotubes towards the center of the aperture 306. In this case, the diameter of the aperture 306 is 100 nm and the depth is 50 nm. In this example, since the electric field distribution around the aperture 306 is substantially symmetric with respect to a central longitudinal axis of the aperture, the CNT 310 is also substantially centered inside the aperture 306. Thus, one end of the CNT 310 is attached to a region of the conductive layer 302 defined by the aperture 306 (i.e., the exposed region at the bottom of the aperture), e.g., within a few nanometers of the center of the defined region.

FIG. 3C shows the electric field distribution after one CNT 310 has been deposited inside the aperture 306. Since the CNT is conductive and is in electrical contact with the conductive layer 302, the electric field distribution is modified by the deposited CNT 310. Furthermore, if the aperture 306 is sufficiently small, as it is in this case, the electric field lines tend to concentrate towards the free end of CNT 310, instead of directing towards the interior of the aperture 306. Thus, the free end of CNT 310 becomes a focal point for further deposition of nanotubes, instead of being deposited at the bottom of the aperture 306.

In general, for a fixed potential difference between the reference electrode and the metal contact at the bottom of the aperture, the strength of the focusing effect is inversely proportional to the diameter of the aperture for a fixed aperture depth.

Figure 4A:
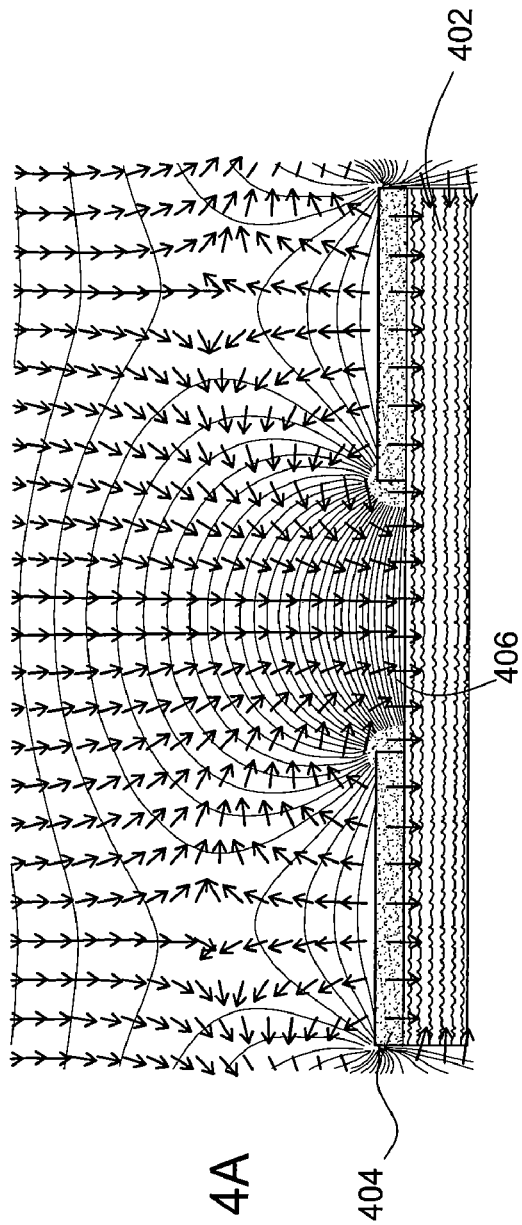
FIGS. 4A-B are schematic illustrations of electric field distributions around an aperture with a diameter of 500 nm and a depth of 50 nm.
Figure 4B:
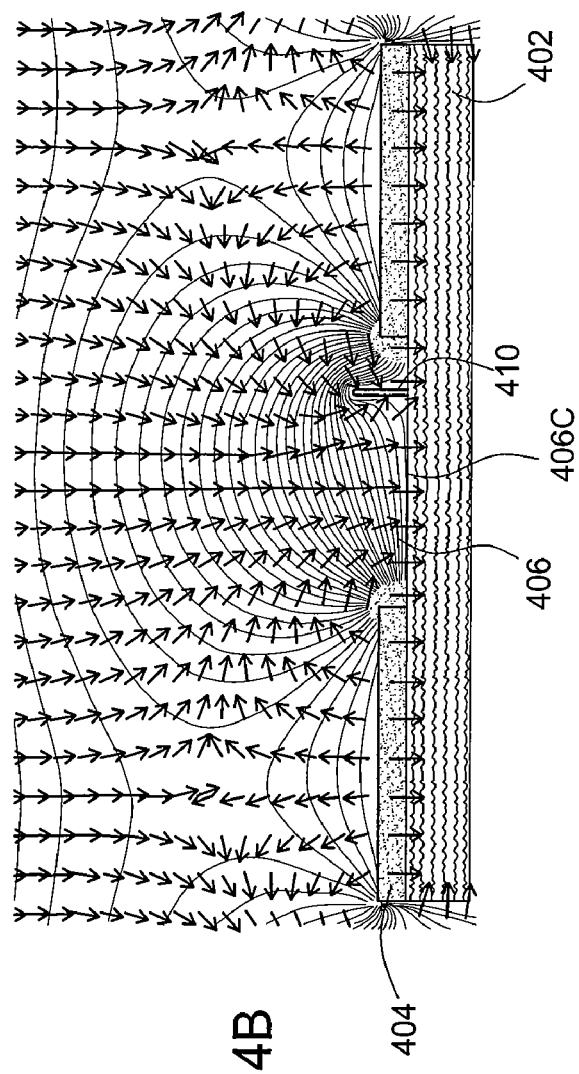

FIG. 4A-B show different results obtained for an aperture 406 having a diameter of 500 nm and a depth of 50 nm, with a negative 10V bias applied to a conductive layer 402. FIG. 4A shows the electric field lines around aperture 406, with $H^+$ ions accumulated on the surface of insulating layer 404, and FIG. 4B shows the electric field lines modified by a CNT 410 inside the aperture 406. In this case, the CNT 410 is positioned with a lateral offset from the center 406C of the aperture 406, which may arise, for example, from a random direction of approach in the bath, followed by the electric field directing the nanotube to its location of deposition. As suggested by the field lines in the figure, more than one CNT may be deposited inside the aperture 406.

In this case, the electric field distribution will not provide a preferential direction to guide the nanotubes towards the center region of the aperture 406. The final location of the nanotube will depend on the initial position of the nanotube before the bias is applied. For a large aperture, e.g., diameter or lateral dimension of greater than about 100 nm, the unattached end of the first deposited nanotube may still be the focal point for further nanotube deposition. However, when the lateral dimension of the aperture is sufficiently large, the electric field will also direct other nanotubes to other locations on the exposed surface of the conductive layer 402.

Although results suggest that an aperture diameter of about 100 nm provide a transition or reference point below which deposition is restricted to a single nanotube, while apertures larger than about 100 nm tend to favor deposition of more than one nanotubes, it is understood that this reference point may vary with specific combinations of nanotubes and/or structural configurations.

Aside from the aperture diameter (or lateral dimension), other parameters, e.g., shape, aspect ratio (defined as depth or height of aperture divided by lateral dimension), among others, may also be used for the purpose of controlling deposition of nanotubes, for example, by providing different configurations according to the nanotube properties and/or geometries.

Results of another finite element analysis also show that, for nanotubes with a 10 nm diameter and a length of 100 nm, and an aperture formed in silicon nitride with a diameter of 100 nm and a depth (or height) of larger than 18 nm, only one nanotube will be deposited inside the aperture. This suggests that an aperture with an aspect ratio of at least 0.18 or greater may be used to restrict the number of deposited nanotubes to only one. For a nanotube with a smaller diameter, a larger aspect ratio may be required in order to restrict the deposition to only one nanotube. Similar analysis can be used to simulate probable locations of deposited nanotubes for other aperture configurations and nanotube properties. While a two dimensional analysis is suitable for situations in which a plane of symmetry is available, a three dimensional analysis can generally be used for other situations. Thus, finite element analysis can be used for nanoscopic lens design as a guide to providing nanotube deposition with additional levels of control.

Many different nanotube-based devices may be fabricated using the method of the present invention. While the method can generally be applied to the deposition of nanotubes within apertures of different dimensions, it is particularly well-suited for situations in which it is desirable to control the number of nanotubes to be deposited or the lateral positioning or alignment of the nanotube. Examples of nanotube-based devices that can benefit from this method include vertical CNT transistors, chemical sensors or biosensors, among others.

The above embodiments and discussions illustrate the capability to controllably deposit a single nanotube with nanoscale lateral precision near a center of a region defined by an aperture. The method is particularly attractive from an implementation or processing viewpoint, because the ability to achieve such controlled deposition within a relatively large region significantly relaxes the requirement for lithographic techniques. As such, the fabrication can readily be performed using optical lithography, without resorting to more complicated lithographic tools (such as e-beam or focused ion beam) to form sufficiently small apertures to define the target deposition region.

Embodiments of the present invention also provide a method of controlling the number of nanotubes to be deposited and their spacings in a given region. Such a method is useful for many applications where it is desirable to deposit more than one nanotube in a defined region. For example, certain vertical field effect transistor (VFET) designs may benefit from having more than one nanotube forming a channel to allow more current to flow through the device. Thus, by controlling the number of nanotubes to be deposited, one can ensure that the VFET output can be designed with sufficient current to meet the parameters of a logic circuit input.

Figure 5:
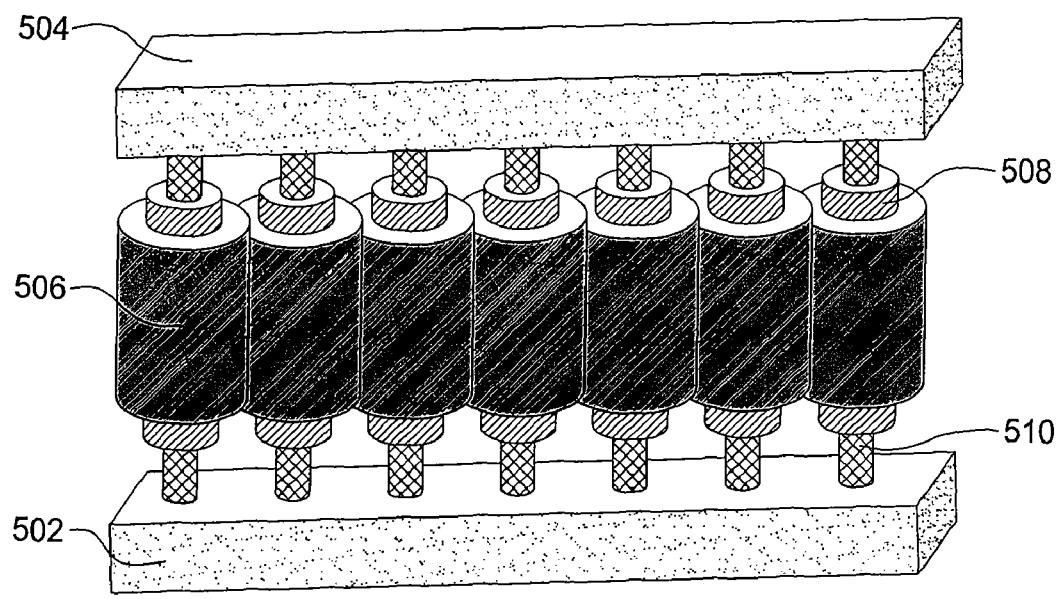
FIG. 5 is a schematic illustration of a nanotube-based transistor that can be fabricated using embodiments of the present invention.

One constraint in the design of the VFET is that the lateral size of the device should be as small as possible to maximize the number of VFETs per unit area. One possibility is to fabricate closely spaced vias and connect each source 502, drain 504, and gate 506 in parallel, as shown in FIG. 5 (with CNT 510 serving as the channel of the device and separated from the gate 506 by gate dielectric 508). This concept was suggested by Hoenlein et al., Materials Science and Engineering C, 23, p. 663-669 (2003); and DE 0010036897 C1, (2000). However, the difficulty with fabricating closely spaced vias for positioning nanotubes is that the number of nanotubes per unit area is solely determined by the minimum diameter of the vias and the separation between vias. This imposes a stringent requirement on lithography and etch processing and, for VFET devices with reasonable maximum current per unit length (1500 microampere per micrometer), sub-20 nm diameter vias will be required.

Embodiments of the present invention will allow a device concept such as that shown in FIG. 5 to be fabricated without imposing stringent requirements on lithography. Specifically, an aperture can be configured to control the number of nanotubes, as well as their spacing or positioning, within the apertured region using electrophoretic deposition.

Figure 6A:
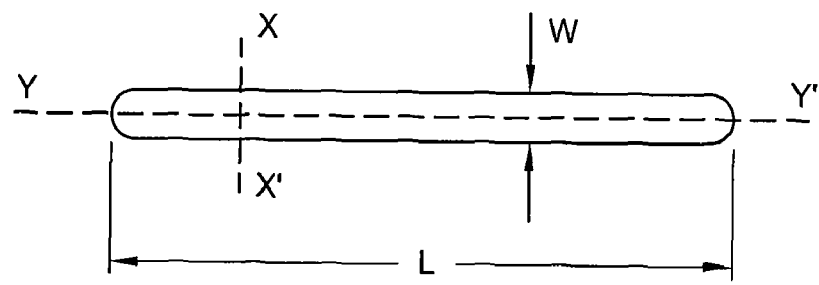
FIGS. 6A-B are schematic illustrations of a configuration of an aperture suitable for implementing embodiments of the present invention.
Figure 6B:
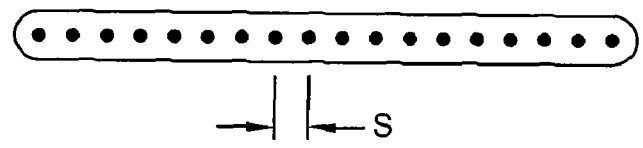

FIGS. 6A-B are schematic illustrations of a top view of an aperture configuration suitable for controlling nanotube deposition. As shown in FIG. 6A, the aperture has an elongated geometry such as a slot, which is characterized by a width (W), also referred to as a lateral or transverse dimension (along a direction indicated by line X-X'), and a length (L), also referred to as a longitudinal dimension (along a direction indicated by line Y-Y'), with L being larger than W. In this example, the width W is designed to be sufficiently narrow so as to allow only one nanotube to be deposited along the transverse direction. Thus, all deposited nanotubes will be deposited in a line pattern, i.e., lined up adjacent to each other, along the longitudinal direction.

Furthermore, the number of nanotubes deposited within the slot can be controlled by the length of the slot. Once a first nanotube is deposited in the slot, the electric field distribution around the slot will be modified. The new field distribution can be calculated using finite element analysis. The closest separation between adjacent nanotubes can also be calculated by using finite element analysis to predict the trajectory of randomly approaching charged particles that are successively deposited in the slot.

Using this analysis for nanotubes having a length of 100 nm, it has been estimated that the closest separation between nanotubes with 1 nm diameter is about 15 nm. For nanotubes with a diameter of 10 nm and a length of 100 nm, the closest separation for adjacent nanotubes is about 20 nm. The same method can be used to calculate the closest separation of nanotubes with any geometry. An alternative method can be used to calculate the electric field in the vicinity of two closely spaced nanotubes and reduce the spacing until the calculated electric field has a distribution that would exclude deposition of a third nanotube in between the two that are already deposited.

Once the closest separation(s) between nanotubes is known, the number of nanotubes, N, deposited in the slot is given by: N=MOD(L/s). The function MODO truncates the resulting number L/s to an integer. The shape at the ends of the slot may also modify this result, depending on the degree of rounding. The calculation is most accurate if there is no rounding. With the presence of rounding, an additional degree of focusing may reduce the number of deposited nanotubes, and this can be determined using three dimensional finite element analysis for the exact geometry.

Embodiments described above can be used for fabricating different carbon nanotube (CNT) devices, e.g., a CNT field effect transistor (CNT-FET). Since the materials and processes for forming a CNT-FET are compatible with those typically used in complementary metal oxide semiconductors (CMOS), such a transistor can readily be integrated with CMOS processing to provide a three dimensional semiconductor structure.

FIGS. 7A-I are schematic cross-sectional views illustrating various structures during a processing sequence for fabricating a vertical CNT-FET according to embodiments of the present invention. The term "vertical" is used to denote the transistor being formed so that the channel lies in a vertical orientation with respect to the plane of a substrate. One embodiment of the present invention provides for the CNT-FET being integrated with one or more CMOS devices, which are provided as "horizontal" devices with their channels in the plane of the substrate.

Figure 7A:
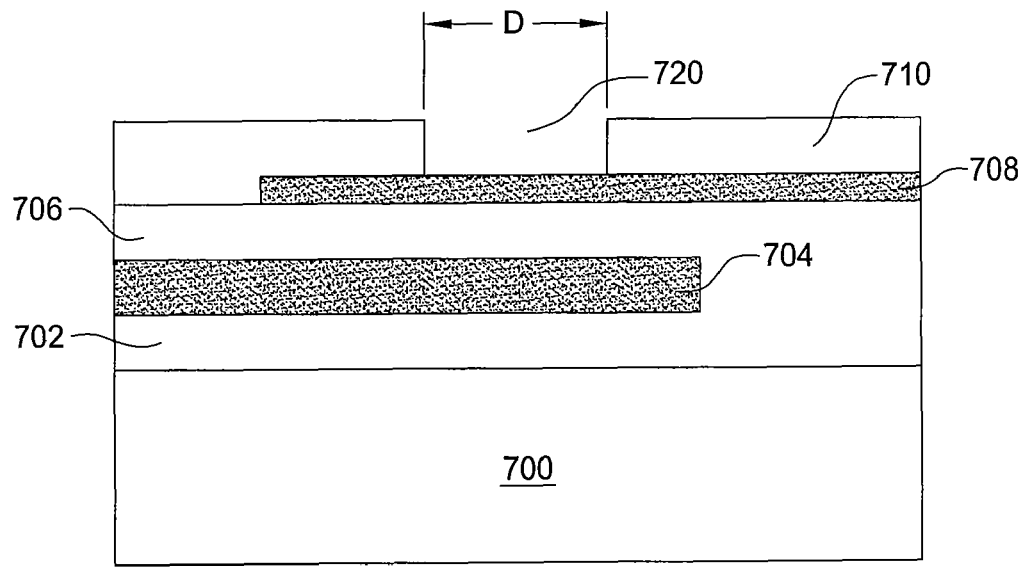
FIGS. 7A-I are schematic cross-sectional views of structure during various stages of a carbon nanotube field effect transistor fabrication sequence.

FIG. 7A shows a structure in which several material layers have been formed over a substrate and processed in previous steps (not shown) using techniques known to one skilled in the art of semiconductor processing. The process sequence to be described can be used to form one or more vertical CNT-FETs in a variety of semiconductor structures, including hybrid structures integrating CNT-FETs with CMOS devices at different stages of fabrication.

For example, in hybrid structures, the vertical CNT-FET (VFET) process steps are inserted into the process flow of the metal levels (i.e. interconnect levels) of the CMOS device. That is, the patterning for the VFET is done at the same time as one or more of the metal levels of the CMOS (at least three metal levels are needed for a VFET) and the VFET level device logic is incorporated into the interconnect levels along with the "horizontal transistor" interconnects. The VFETs becomes a part of the entire logic diagram along with the "horizontal transistor" logic.

FIG. 7A shows a structure that includes an insulating layer 702 on a substrate 700, which may generally be a silicon (Si) wafer, or the insulating layer may be the dielectric layer on which any of the appropriate metal levels is deposited in a CMOS integrated circuit and will depend on the circuit layout. Materials suitable for use as the insulating layer 702 include silicon oxide ($SiO_2$), silicon nitride, among others.

A conductive layer 704 is formed by depositing a suitable material, e.g., Al, Cu, TiN, or Co, over the insulating layer 702 and patterned to form a source (or drain) of the vertical CNT-FET. The material for conductive layer 704 should have sufficient adhesion to the CNT (to be formed as the channel and discussed in a later deposition step, e.g., FIG. 7F-G) during processing and minimal contact resistance with the CNT after the processing is completed. The sheet resistance of the material should also be sufficiently low to be compatible with low current operation, as are Al and Cu in standard CMOS integrated circuits. Alternatively, the contact between the CNT channel and the VFET source and drain may be provided as a composite material, which may include a metal known to have good adhesion and low contact resistance combined with another metal with a low sheet resistance. Combinations such as Co/Al, Co/Cu, Fe/Al, Fe/Cu may be suitable with Co or Fe in direct contact with the CNT. Most metals that are used as seed metals in chemical vapor deposition of CNTs may also be suitable to be in direct contact with EPD deposited CNTs.

Furthermore, if the CNT-FET is to be integrated with the first metal level of a CMOS device, then the substrate 700 may correspond to the wafer and all of the process levels preceding the dielectric 1 level, while insulating layer 702 and conductive layer 704 may correspond to the dielectric 1 (D1) and metal 1 (M1) levels of the CMOS device, respectively. For example, the patterning of the conductive layer 704 to form the source/drain of the CNT-FET is performed at the same mask level as M1 of the CMOS device.

After the conductive layer 704 is patterned, an insulating material is deposited and the resulting structure is polished to form a planarized dielectric layer 706. The thickness of the dielectric layer 706, which corresponds to a separation between the source 740 and the gate (to be formed) of the CNT-FET, is determined by the device specification. Dielectric layer 706 may correspond to dielectric 2 (D2) level of the CMOS device in an integrated structure.

A conductive material is provided over the dielectric 706 and patterned to form a conductive layer 708, which, after further processing to be described below, will form a gate of the CNT-FET. In one embodiment, the material is aluminum (Al) having a thickness in a range from about 10 nm to about 100 nm depending on the requirements of the circuit design. Another suitable material includes copper, Cu. In the case of an integrated CNT-FET and CMOS process, in which the gate metal of the CNT-FET also acts as M2 in the CMOS metal stack, the material for the gate will also have to satisfy all of the current carrying specifications required by M2. Alternatively, the gate metal for the vertical CNT-FET may be provided as a separate metal level between two of the normal metal levels in the CMOS metal stack (i.e., requiring an additional metal level for each level of vertical CNT-FET).

A dielectric layer 710 is formed by depositing an insulating material and patterning, e.g., with optical lithography, to define an aperture 720, as shown in the structure of FIG. 7A. In one embodiment, the aperture 720 has a diameter (D), or lateral dimension, of less than or equal to about 100 nm. The diameter D should be sufficiently large to accommodate a nanotube to be deposited onto conductive layer 708. In one embodiment, the diameter D has a lower limit corresponding to the resolution limit of a lithography process used for defining the aperture 720. For example, a resolution of about 90 nm can be obtained with conventional optical lithography at 193 nm. The dielectric layer 710 may correspond to a dielectric 3 (D3) level of the CMOS device.

Figure 7B:
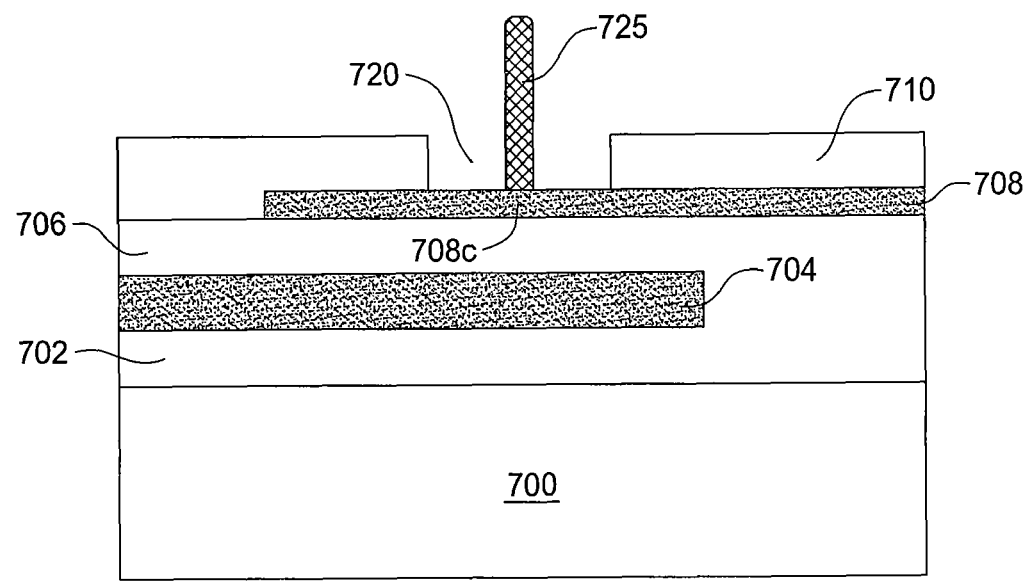

FIG. 7B shows a structure in which a multi-walled carbon nanotube (MWNT) 725 is formed over the region of the conductive layer 708 that is exposed or defined by aperture 720. In one embodiment, MWNT 725 has a diameter of between about 10 nm and about 40 nm. As will be shown below, MWNT 725 is used to define another nanoscale via or aperture, which in turn will define a region for the deposition of a single-walled nanotube to serve as a channel of the FET.

According to embodiments of the present invention, the MWNT 725 is deposited by electrophoresis, as previously discussed. For example, a suspension of MWNT nanotubes, e.g., pre-sorted, may be used. The parameters for electrophoresis and the configuration of aperture 720 are selected such that only one MWNT 725 is deposited inside aperture 720. As previously mentioned, aperture 720 is sufficiently large to accommodate the diameter of the MWNT to be deposited within the aperture. Furthermore, the aperture 720 is configured so that it will allow only a single MWNT to be deposited in the aperture. In general, the maximum diameter of 720 depends on the diameter of the nanotube, the length of the nanotube, and the depth of the aperture. It can be estimated using finite element analysis for the specific geometry that is required by the circuit design. Furthermore, MWNT 725 is substantially centered within aperture 720 such that it is substantially vertically oriented, and its end is proximate a center 708C of the defined region on conductive layer 708, e.g., within a few nanometers from the center 708C.

After deposition of the MWNT 725, the wafer is rinsed in distilled and deionized water.

Figure 7C:
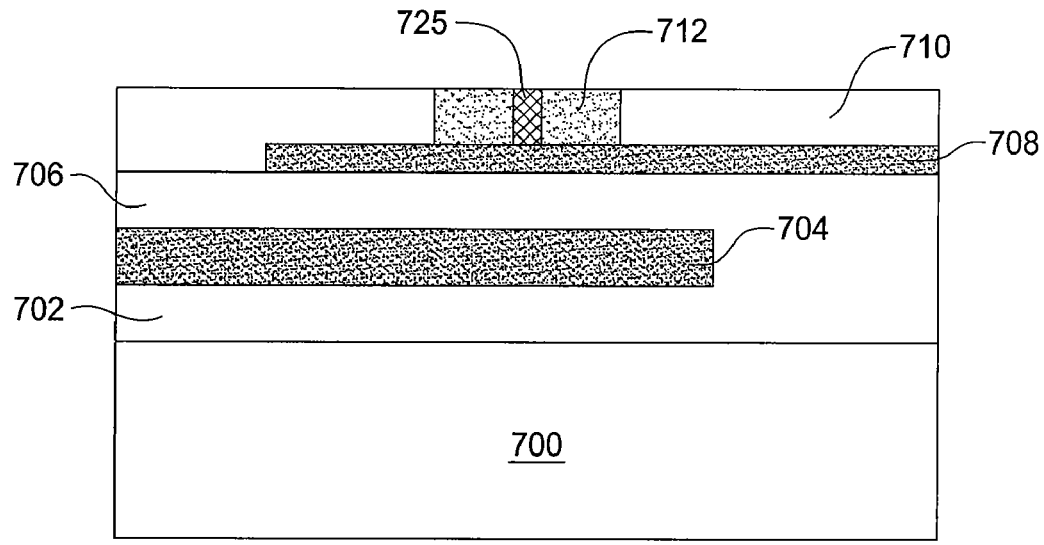

In a subsequent step, a dielectric material 712 is deposited over the structure of FIG. 7B, preferably with sufficient thickness to at least substantially fill the aperture 720 and above the top surface of the dielectric layer 710. The structure with the dielectric material 712 is then polished, e.g., by chemical mechanical polishing (CMP), down to the dielectric layer 710. The resulting structure is shown in FIG. 7C, with the surfaces of the dielectric material 712 and insulating layer 710 being planarized. The remaining thickness of the dielectric layer 710, which corresponds to the separation between the gate metal and the source/drain metal, is determined by the device specifications.

Figure 7D:
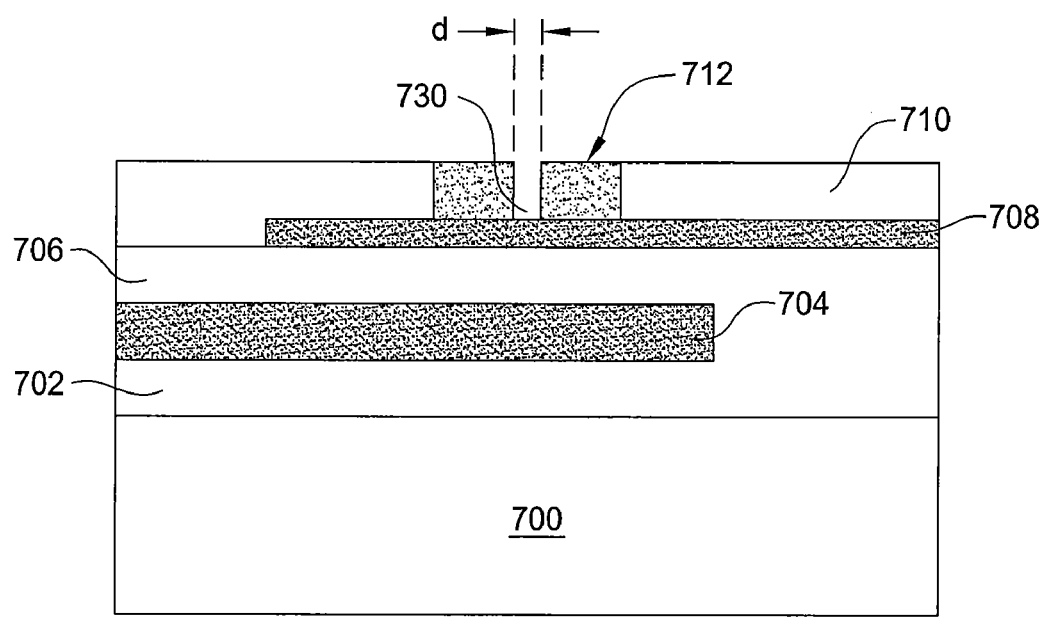

FIG. 7D shows a structure after the next process step, in which the MWNT 725 is removed, either by oxidation or chemical etching, e.g., with an oxygen plasma, or with a process that is selective to the dielectric material 712 and conductive material 708. Thereafter, with the planarized layers 710 and 712 acting as a mask, conductive layer 708 is etched down to stop at the insulating layer 706. As shown in FIG. 7D, an aperture 730, having a diameter or lateral dimension (d) corresponding to that of the MWNT 725, is now formed in the conductive layer 708, exposing the underlying insulating layer 706.

Figure 7E:
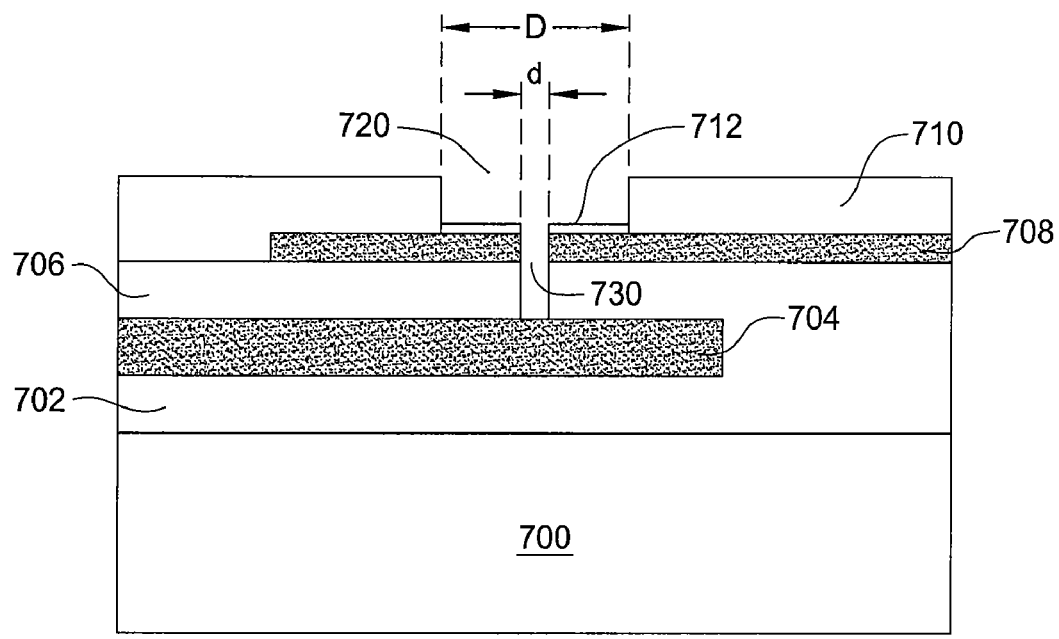

FIG. 7E shows the next step, in which the dielectric material 712 is partially removed by etching at least a top portion of the dielectric material 712, thus effectively "restoring" the aperture 720 previously formed in insulating layer 710. Alternatively, dielectric material 712 may also be completely removed to expose an underlying region of the conductive layer 708 and the aperture 720.

Aperture 730 is extended through the insulating layer 706 to stop at the conductive layer 704. Preferably, the conductive layer 708 acts as an etch mask for the etch of insulating layer 706 using a reactive ion etch process. It is also preferable that the etches for 712 and 706 do not significantly etch insulating layer 710. A region of the conductive layer 704 is thus defined by the aperture 730, with a lateral dimension d corresponding to the diameter of the MWNT 725, e.g., in the range of approximately 10 nm to 40 nm. Aperture 720, on the other hand, has a diameter D larger than aperture 730, with aperture 730 being substantially centered with respect to aperture 720.

Figure 7F:
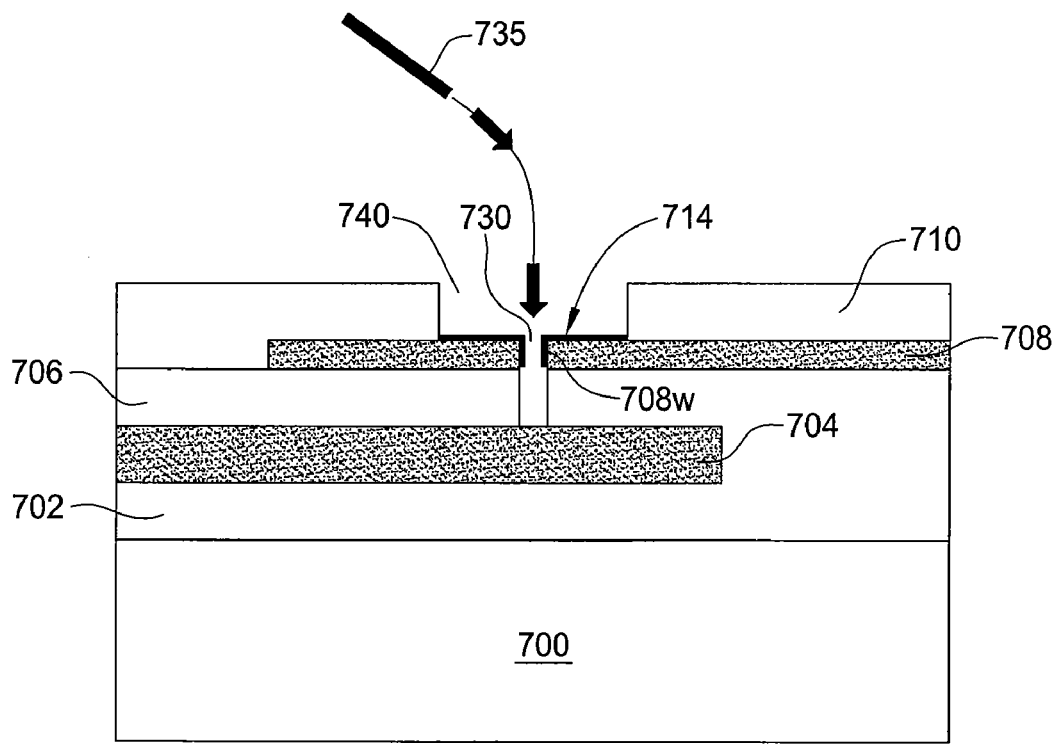
Figure 7G:
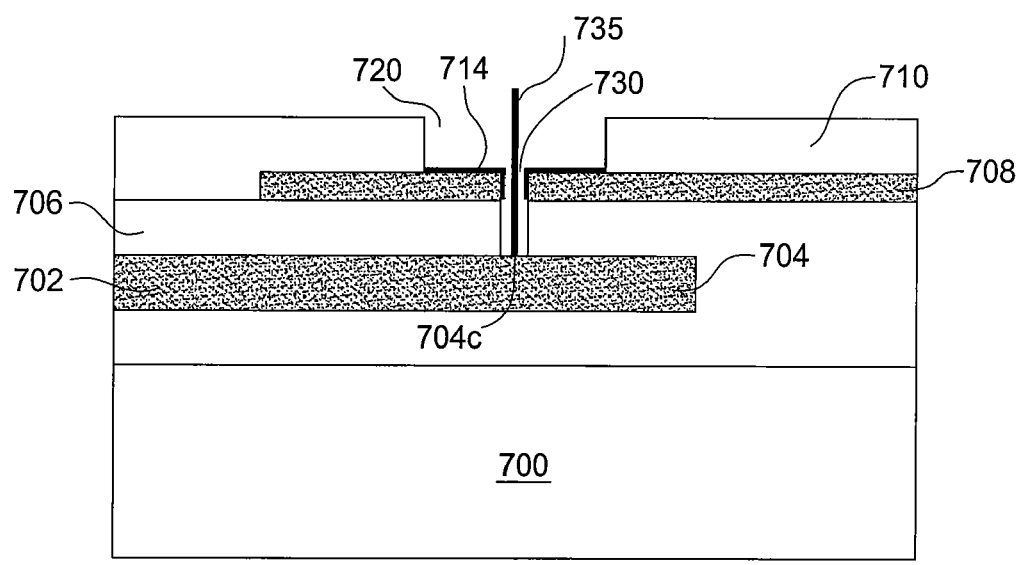

FIG. 7F illustrates a subsequent step of depositing a SWNT (to serve as a channel of the FET) and forming a gate dielectric. Various options are available at this stage for forming dielectric 714 around the vertical sidewall 708W of conductive layer 708, which will be the gate of the CNT-FET. One possible approach is to deposit the SWNT 735 inside aperture 730 prior to forming the gate dielectric. In one embodiment, the SWNT 735 can be deposited using electrophoresis as previously discussed. An appropriate bias voltage from a DC source can be applied to the conductive layer 708 via connections to electrical contacts at the edge of the substrate 700. The electric field distribution arising from charge accumulation at the surface of insulating layer 710 will direct and focus the SWNT 735 towards the center of aperture 720, which also substantially coincides with the center of the aperture 730. Thus, the electric field focusing allows SWNT 735 to be automatically aligned within the much smaller aperture 730, without the need for more elaborate alignment schemes. As shown in FIG. 7G, the deposited SWNT 735 has one end contacting the conductive layer 704 close to the center 704C of the region defined by aperture 730.

A suitable dielectric material (e.g., silicon nitride of 2 nm to 30 nm) is then deposited to form a conformal dielectric layer 714 over the conductive layer 708 covering the sidewall 708W and the SWNT 735, as shown in FIG. 7G.

Referring back to FIG. 7F, other variations to the sequence of forming the SWNT 735 and gate dielectric 714 may also be used, including for example depositing gate dielectric 714 prior to deposition of SWNT 735, using the native oxide on the conductor 708 or by developing a plasma enhance chemical vapor deposition (PECVD) process to deposit an ultrathin gate dielectric on conductive layer 708 while using an electric field to keep conductive layer 704 clear of gate dielectric during PECVD, and depositing SWNT 725 by EPD after gate dielectric deposition.

Figure 7H:
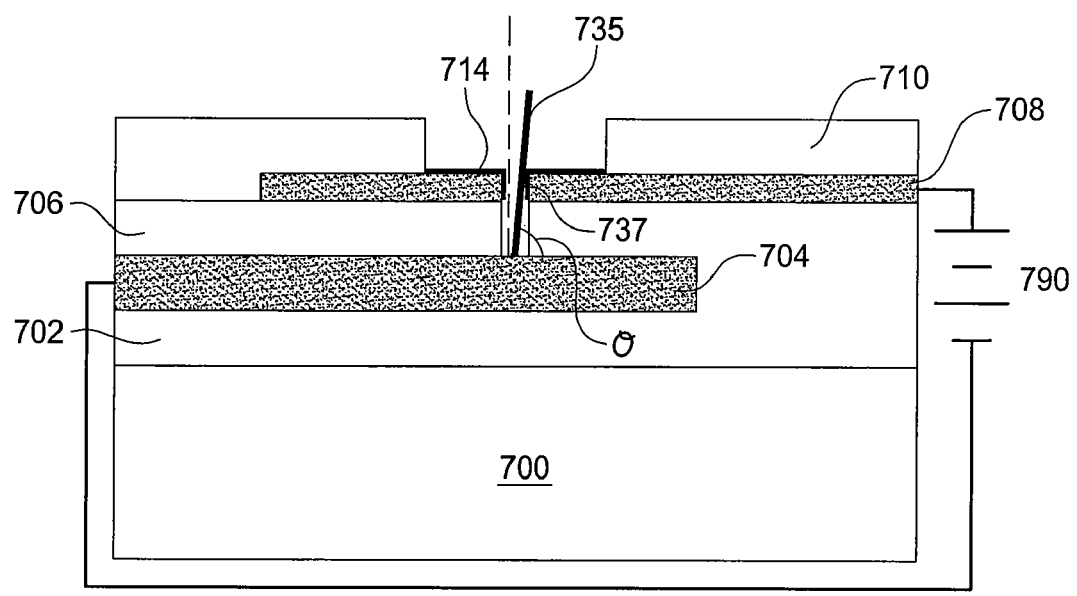

After the deposition of SWNT 735 and gate dielectric formation, the next step involves positioning or orienting SWNT 735 so that it can contact the dielectric layer 714 at the sidewall 708W of the conductive layer 708. This can be done by applying a voltage across conductive layers 704 and 708, as shown in FIG. 7H. The DC voltage source 790 may be an external source connected to both conductive layers 704, 708 through contact pads (not shown) at the edge of the wafer substrate 700. The SWNT 735 is pulled to one side, i.e., away from its perpendicular or vertical direction (indicated by a dashed line in FIG. 7H), thus forming an angle θ that is less than 90° with the top surface of the conductive layer 704. The portion 737 of SWNT 735 that contacts the dielectric 714 would correspond to the channel region of the CNT-FET. Minimizing the distance between the channel region and the sidewall 308W (the gate) is expected to provide improved performance in the CNT-FET.

Referring back to FIG. 7F, another variation involves making the aperture 730 small enough, i.e., as defined by the deposited MWNT 725 (see FIG. 7C-D), so that there is about sufficient space to accommodate the SWNT 735 and the gate dielectric 714. After depositing SWNT 735, a suitable dielectric material is deposited to fill the remainder of the aperture 730 region around the SWNT 735, while using an electric field to keep conductive layer 704 clear of gate dielectric during PECVD. This method would require that the MWNT 725 be presorted in the EPD suspension to provide a narrow range of nanotube diameters for the step deposition shown in FIG. 7B.

In the next step (i.e., after SWNT deposition and gate dielectric formation), a sufficiently thick layer of dielectric material 716 is deposited inside apertures 730 and 720 to surround the SWNT 735 (see FIG. 7I), as well as to cover the insulating layer 710. The material 716 is then polished back to form a planarized surface with insulating layer 710 and the other end of SWNT 735. The remaining thickness of the dielectric layers 716 and 710, which corresponds to the separation between the gate metal and the source/drain metal, is determined by the device specifications.

A conductive material (e.g., Al, Cu, TiN, or Co) is deposited over the planarized structure and patterned to form a drain (or source) 718 of the CNT-FET. The material for conductive layer 718 should have minimal contact resistance with the CNT 735 after the processing is completed. The sheet resistance of the material should also be sufficiently low to be compatible with low current operation, as are Al and Cu in standard CMOS integrated circuits. Alternatively, the contact between the CNT 735 and the VFET drain may be provided as a composite material, which may include a metal known to have good adhesion and low contact resistance combined with another metal with a low sheet resistance. Combinations such as Co/Al, Co/Cu, Fe/Al, Fe/Cu may be suitable with Co or Fe in direct contact with the CNT 735. Most metals that are used as seed metals in CVD of CNTs may also be suitable to be in direct contact with EPD deposited CNTs.

Figure 7I:
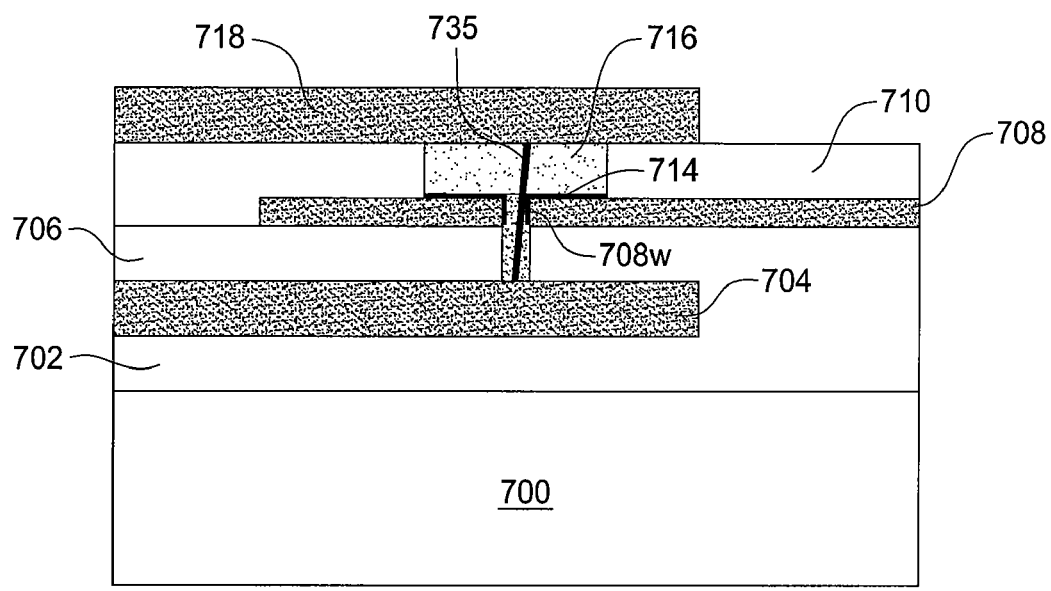

FIG. 7I shows the vertical CNT-FET, with its source region formed by conductive layer 704, a channel provided by SWCNT 735, a gate formed by the vertical sidewall 708W of conductive layer 708, the gate dielectric 714 at the gate region of 708W, and the drain region formed by conductive layer 718.

After completion of the vertical CNT-FET, electrical connections to conductive layers 704, 708 that are used for fabrication purpose, e.g., for electrophoresis, are severed using techniques known to one skilled in the art. Another level of vertical FET may be fabricated above the conductive layer 718.

As shown above, embodiments of the present invention provide a method for controllable depositing nanotubes using electrophoresis in a defined region. The deposition region may be defined by an aperture, which can be configured to control the number of nanotubes that can be deposited in the region, as well as the spacings of deposited nanotubes. By properly configuring the aperture, e.g., providing a sufficiently small aperture size such as less than about 100 nm, one can also control the deposition such that only a single nanotube is deposited in the region, with lateral alignment precision of a few nanometers.

Embodiments of the invention also provide a room temperature process that is readily scalable and compatible with conventional fabrication processes and materials, and allow improved control over the properties of nanotubes being used in device fabrication. Furthermore, the process allows integration of nanotube field effect transistors with CMOS devices.

Although some examples have been discussed in the context of the deposition of carbon nanotubes, it is understood that the method can generally be adapted for deposition of other nanotubes. Furthermore, embodiments of the invention can generally be applied to depositing single-walled, multi-walled, semiconducting or metallic nanotubes for fabrication of different devices.

While the foregoing is directed to embodiments of the present invention, other and further embodiments of the invention may be devised without departing from the basic scope thereof, and the scope thereof is determined by the claims that follow.

What is claimed is:

1. A method of forming a nanotube field effect transistor (FET), comprising:
   providing a multi-layer stack having materials in an order of: a first conductive layer, a first insulating layer, a second conductive layer, and a second insulating layer;
   forming a first aperture in at least a top portion of the second insulating layer;
   forming a second aperture in the second conductive layer and the first insulating layer to expose a region of the first conductive layer, the second aperture being centrally aligned with respect to the first aperture and having a diameter smaller than a diameter of the first aperture;
   generating an electric field proximate to the first aperture, the electric field configured to direct a plurality of nanotubes towards the exposed region of the first conductive layer;
   depositing a first nanotube on the exposed region of the first conductive layer by electrophoresis, with a first end of the first nanotube contacting the exposed region of the first conductive layer proximate a center of the exposed region of the first conductive layer;
   wherein the first aperture and the second aperture are sized to allow the plurality of nanotubes to contact the exposed region of the first conductive layer; and
   wherein after the first nanotube is deposited, the deposited first nanotube re-configures the electric field to thereby prevent other nanotubes from the plurality of nanotubes from being deposited on the exposed region of the first conductive layer.

2. The method of claim 1, wherein the first aperture exposes a region of the second conductive layer; and
   wherein the step of forming the second aperture includes the steps of:
   (i) depositing a second nanotube on the exposed region of the second conductive layer by electrophoresis, with a first end of the second nanotube contacting the exposed region of the second conductive layer proximate a center of the exposed region of the second conductive layer;
   (ii) depositing a dielectric material in the first aperture to substantially fill the first aperture with the dielectric material;
   (iii) removing the second nanotube to form a third aperture in the substantially filled first aperture, the third aperture having a diameter substantially the same as the diameter of the removed second nanotube;

(iv) forming the second aperture in the second conductive layer and the first insulating layer to expose a region of the first conductive layer, the second aperture having a diameter substantially the same as the diameter of the third aperture; and (v) substantially removing the dielectric material from the first aperture; and wherein the first nanotube is a single-walled carbon nanotube, the second nanotube is a multi-walled carbon nanotube, and the plurality of nanotubes are single-walled carbon nanotubes.

3. The method of claim 1, wherein the first nanotube is a single-walled carbon nanotube.

4. The method of claim 1, wherein the electrophoresis comprises applying a bias voltage to the second conductive layer.

5. The method of claim 4, wherein the electrophoresis further comprises exposing the multi-layer stack to a suspension of nanotubes in a liquid bath containing an electrolyte, and applying the bias voltage between the second conductive layer and an electrode in the liquid bath.

6. The method of claim 1, wherein the first conductive layer forms one of a source or a drain of the FET, and the second conductive layer forms a gate of the FET.

7. The method of claim 1, further comprising:
providing a dielectric layer over a vertical sidewall of the second conductive layer inside the second aperture, the dielectric layer forming a gate dielectric of the FET.

8. The method of claim 1, further comprising:
providing a third conductive layer over the second insulating layer, the third conductive layer contacting one end of the first nanotube and forming one of a source or a drain of the FET.

9. The method of claim 1, wherein the first and second conductive layers are each provided as a part of two metallization mask levels of a complementary metal oxide semiconductor (CMOS), the CMOS and the FET being devices in one semiconductor structure.

10. A method of forming a nanotube field effect transistor (FET), comprising:
providing a structure having at least a top conductive layer over an insulating layer formed on a bottom conductive layer;
forming an aperture through the top conductive layer and the insulating layer to expose: (i) a vertical sidewall of the top conductive layer and, (ii) a horizontal region of the bottom conductive layer, the aperture sized to allow a plurality of nanotubes to contact the exposed horizontal region of the bottom conductive layer;
forming a dielectric layer over the vertical sidewall of the top conductive layer;
generating an electric field proximate to the aperture, the electric field configured to direct the plurality of nanotubes towards the exposed horizontal region of the bottom conductive layer;
depositing a first nanotube on the exposed horizontal region of the bottom conductive layer by electrophoresis, with a first end of the first nanotube contacting the exposed horizontal region of the bottom conductive layer proximate a center of the horizontal region, and the deposited first nanotube re-configuring the electric field to thereby prevent other nanotubes from the plurality of nanotubes from being deposited on the exposed horizontal region of the bottom conductive layer; and orienting the first nanotube to provide contact between an intermediate portion of the first nanotube and the dielectric layer.

11. The method of claim 10, wherein orienting the first nanotube is performed by applying a voltage across the top conductive layer and the bottom conductive layer.

12. The method of claim 10, wherein the bottom conductive layer forms one of a source or a drain of the FET, the top conductive layer forms a gate of the FET, the dielectric layer forms a gate dielectric of the FET, and the intermediate portion of the first nanotube forms a channel region of the FET.

13. A method of forming a semiconductor structure, comprising:
forming a horizontal field effect transistor (FET) on a substrate;
forming a vertical nanotube field effect transistor (NT-FET) over the horizontal FET;
wherein the vertical NT-FET is formed using a method comprising:
(a) providing a structure having at least a first insulating layer on a first conductive layer;
(b) forming a first aperture in the first insulating layer to expose a region of the first conductive layer;
(c) generating an electric field proximate to the first aperture, the electric field configured to direct a plurality of nanotubes towards the exposed region of the first conductive layer;
(d) depositing a nanotube on the exposed region of the first conductive layer by electrophoresis, the deposited nanotube having one end contacting the exposed region of the first conductive layer proximate a center of the exposed region;
wherein the first conductive layer forms one of a source or a drain of the NT-FET;
wherein the first aperture is sized to allow the plurality of nanotubes to contact the exposed region of the first conductive layer; and
wherein after the nanotube is deposited, the deposited nanotube re-configures the electric field to thereby prevent other nanotubes from the plurality of nanotubes from being deposited on the exposed region of the first conductive layer.

14. The method of claim 13, wherein the structure further comprises a second conductive layer formed on the first insulating layer, and a second insulating layer formed on the second conductive layer;
the method further comprising:
forming a second aperture in the second insulating layer, the second aperture having a diameter larger than a diameter of the first aperture and being centrally aligned with the first aperture;
performing electrophoresis by applying a bias voltage to the second conductive layer, while immersing the structure to a liquid bath containing a suspension of nanotubes.

15. A method of forming a plurality of nanotube field effect transistors; comprising:
providing a first insulating layer over a first conductive layer;
forming an elongated aperture in the first insulating layer to expose a region of the first conductive layer, the aperture characterized by a width and a length larger than the width;
generating an electric field proximate to the aperture, the electric field configured to direct a first plurality of nanotubes to the exposed region of the first conductive layer;

depositing a second plurality of nanotubes in a line pattern on the exposed region of the first conductive layer by electrophoresis;

wherein the width of the aperture is sufficiently small to restrict deposition of the second plurality of nanotubes to the line pattern and the number of nanotubes in the second plurality of nanotubes is determined at least in part by the length of the aperture;

wherein the aperture is sized to allow the first plurality of nanotubes to contact the exposed region of the first conductive layer;

wherein after the second plurality of nanotubes is deposited, the deposited second plurality of nanotubes reconfigures the electric field to thereby prevent other nanotubes from the first plurality of nanotubes from being deposited on the exposed region of the first conductive layer; and wherein the number of nanotubes in the first plurality of nanotubes is greater than the number of nanotubes in the second plurality of nanotubes.

* * * * *